United States Patent
Iacopi

(10) Patent No.: US 9,011,600 B2
(45) Date of Patent: Apr. 21, 2015

(54) CHEMICAL VAPOUR DEPOSITION SYSTEM AND PROCESS

(75) Inventor: Alan Victor Iacopi, Thornlands (AU)

(73) Assignee: Griffith University, Nathan, Queensland (AU)

( * ) Notice: Subject to any disclaimer, the term of this patent is extended or adjusted under 35 U.S.C. 154(b) by 371 days.

(21) Appl. No.: 13/148,942

(22) PCT Filed: Feb. 12, 2010

(86) PCT No.: PCT/AU2010/000153
§ 371 (c)(1),
(2), (4) Date: Aug. 10, 2011

(87) PCT Pub. No.: WO2010/091473
PCT Pub. Date: Aug. 19, 2010

(65) Prior Publication Data
US 2011/0312162 A1    Dec. 22, 2011

(30) Foreign Application Priority Data
Feb. 12, 2009 (AU) ................................ 2009900575

(51) Int. Cl.
| | | |
|---|---|---|
| C23C 16/00 | (2006.01) | |
| C23C 16/46 | (2006.01) | |
| C23C 16/44 | (2006.01) | |
| C30B 25/08 | (2006.01) | |
| C30B 29/36 | (2006.01) | |
| C23C 16/32 | (2006.01) | |

(52) U.S. Cl.
CPC ............. *C23C 16/46* (2013.01); *C23C 16/4412* (2013.01); *C30B 25/08* (2013.01); *C30B 29/36* (2013.01); *C23C 16/325* (2013.01); *C23C 16/4404* (2013.01)

(58) Field of Classification Search
CPC . H01L 21/20; H01L 21/0228; H01L 21/0262; H01L 21/28194; H01L 21/28556; C23C 16/4412; C23C 16/4414
USPC .................. 118/715, 724; 438/478, 584, 680
See application file for complete search history.

(56) References Cited

U.S. PATENT DOCUMENTS

| | | |
|---|---|---|
| 4,761,134 A | 8/1988 | Foster |
| 5,053,255 A | 10/1991 | Boeglin |

(Continued)

FOREIGN PATENT DOCUMENTS

| | | |
|---|---|---|
| DE | 3701691 A1 | 2/1988 |
| EP | 0058244 A3 | 8/1982 |
| EP | 0781739 A1 | 7/1999 |
| GB | 2335203 A | 9/1999 |
| JP | 54-090967 A | 7/1979 |
| JP | 2006-206718 A | 7/1994 |
| JP | 2001-185500 A | 7/2001 |
| JP | 2004-047558 A | 2/2004 |
| JP | 2004-216233 A | 8/2004 |
| JP | 2008-263224 A | 10/2008 |
| WO | 2004/064125 A1 | 7/2004 |
| WO | WO 2006/023894 A2 | 3/2006 |

OTHER PUBLICATIONS

International Search Report corresponding to the PCT application No. PCT/AU2010/000153, date of mailing Apr. 7, 2010, 4 pages total.

*Primary Examiner* — Khiem D Nguyen
(74) *Attorney, Agent, or Firm* — Kilpatrick Townsend & Stockton LLP

(57) ABSTRACT

A chemical vapour deposition system, including: a process tube for receiving at least one sample, the process tube being constructed of silicon carbide, impregnated with silicon, and coated with silicon carbide; a pumping system to evacuate the process tube to high vacuum; one or more gas inlets for introducing one or more process gases into the evacuated process tube; and a heater to heat the process tube and thereby heat the one or more process gases and the at least one sample within the process tube to cause a material to be deposited onto the at least one sample within the process tube by chemical vapour deposition.

33 Claims, 3 Drawing Sheets

(56) References Cited

U.S. PATENT DOCUMENTS 5,914,001 A    6/1999   Hansen
6,274,507 B1*   8/2001   Narita et al. .................. 438/758
6,605,151 B1    8/2003   Wessels et al.
2004/0072449 A1*   4/2004   Takaara ........................ 438/778
2005/0000437 A1*   1/2005   Tombler et al. ............... 118/722
2006/0046450 A1*   3/2006   Narendar et al. ............. 438/585
2006/0150904 A1*   7/2006   Ozaki et al. .................. 118/715

* cited by examiner

CHEMICAL VAPOUR DEPOSITION SYSTEM AND PROCESS

CROSS-REFERENCE TO RELATED APPLICATIONS

This application is a U.S. National Stage of PCT Application No. PCT/AU2010/000153, filed Feb. 12, 2010, which claims the benefit of Australian Patent Application No. 2009900575, filed Feb. 12, 2009, the contents of both applications hereby incorporated by reference in their entirety for all purposes.

TECHNICAL FIELD

The present invention relates to a chemical vapour deposition (CVD) system and process, and in particular to a system and process for depositing semiconductors such as silicon carbide.

BACKGROUND

Due to its advantageous electrical and chemical properties and its substantial natural abundance, the elemental semiconductor silicon is probably the most studied substance on Earth and is the dominant material used in the manufacture of micro/nano-electronic devices, micro/nano-electro-mechanical devices and systems (MEMS/NEMS), photovoltaic devices, and other related technologies.

Notwithstanding its many advantages and the unrivalled expertise in its processing and properties that has developed over more than 50 years, other semiconductors can have advantages over silicon for some applications. For example, the higher carrier mobilities, wide bandgaps, and direct bandgaps of some compound semiconductors make such materials preferable for use in extremely high speed specialised micro/nano-electronic devices and light emitting devices such as solid state lasers and light emitting diodes (LEDs).

One compound semiconductor of great interest is silicon carbide (SiC), an extremely hard ceramic material having a wide bandgap, high thermal conductivity, a low thermal expansion coefficient, the ability to conduct high current densities, and high chemical resistance. Moreover, silicon carbide is the only semiconductor other than silicon itself that reacts with oxygen to form a device quality insulating oxide of $SiO_2$, thus greatly facilitating the fabrication of semiconductor devices. Other compound semiconductors generally require a device quality dielectric layer to be deposited, a substantial shortcoming that it one of the reasons why such materials have not been widely adopted. Finally, SiC can be doped to form n-type and p-type conducting regions by introducing impurities (e.g., nitrogen and aluminium). These properties have enabled SiC to become an important material for the manufacture of high temperature and high power electronic devices, and also indicate its further potential for the development of discrete devices, integrated circuits and MEMS/NEMS devices with superior properties to those of devices made from silicon, including high chemical resistance and radiation hardness, high temperature operation, high power capability, high speed and high efficiency operation.

Although silicon carbide wafers are commercially available, they are extremely expensive and are only available in small wafer sizes (e.g., 2 inch diameter @ A$1,500, and 4 inch @ A$5,000), due to the difficulty of growing SiC with sufficient low defect densities for device applications. Boules of single-crystal SiC are formed at temperatures around 2200° C., which poses extreme challenges for processing equipment. For comparison, boules of single-crystal silicon are formed at substantially lower temperatures around 1410° C. 150 mm (≈6 inch) diameter prime silicon wafers cost only about A$30 per wafer.

Silicon carbide has an extremely large number of different polytypes, with the 4H and 6H being the most common polytypes used to form bulk wafers. However, thin layers of the 3C polytype can be epitaxially grown on Si wafers, thereby allowing highly evolved and well characterized silicon chip technology to be combined with the enabling properties of silicon carbide to provide enhanced capabilities on a cost-effective platform that can be rapidly introduced to the market. Additionally, an epitaxial film of silicon carbide on a silicon wafer can also be used as a buffer layer for the subsequent deposition of one or more layers of other single-crystal semiconductors having compatible lattice constants to enable the fabrication of devices from these materials at relatively low cost and using silicon wafer processing equipment.

Device manufacturing in SiC generally requires high quality single-crystal SiC with low defect and impurity densities. Where the SiC is in the form of a layer epitaxially grown on a single-crystal silicon substrate, the large lattice mismatch between silicon and silicon carbide prevents a perfect crystal transition from silicon to silicon carbide. Additionally, impurities introduced into the SiC film during deposition can degrade its quality. Moreover, such impurities can preferentially precipitate or otherwise be trapped at defects within the SiC crystal lattice and/or may even cause the formation of anti-phase boundaries, stacking faults and/or dislocations, thereby further degrading the electronic and optical properties of the SiC film.

Epitaxial deposition of compound semiconductors by low pressure chemical vapour deposition (LPCVD) is generally a slow process. Due to the limited surface mobilities of the atomic species deposited onto the growth surface, long deposition times are required to enable those species to move to the lowest energy atomic locations and thus form high quality single crystal materials with low defect densities. However, long processing times also increase the potential for contamination. Undesirable impurities such as water vapour, oxygen, gaseous oxide and nitrogen typically have very high sticking coefficients and can easy be adsorbed onto or react with the surface of the deposited semiconductor film, thus contaminating the film. By contrast, gaseous deposition precursors such as silane (in the case of SiC deposition) can have very low sticking coefficients (depending upon the process conditions), whereby only fractions of a percent of surface collisions result in the desired atomic species (e.g., silicon in the case of silane) remaining on the surface. Hence it is extremely important to ensure that the levels of contaminants are very low.

In the scientific literature dating back decades, many attempts to deposit device quality silicon carbide on silicon have been made, with very limited success overall. In particular, attempts to develop processes and apparatus for the commercial scale production of 3C silicon carbide on silicon wafers have been unsuccessful.

For example, one such attempt is described in Nagasawa and Yagi, 3*C-SiC single crystal films grown on Si Substrates*, Phys. Stat. Sol. (b) 202, 335 1997 (hereinafter "Nagasawa"). Nagasawa describes a SiC deposition system having a hot walled silica reaction tube. However, at low pressures and high temperature, silica is not leak tight and hence allows contaminants to pass through the tube wall. Additionally, due to the pumping system and vacuum integrity of the system (leak tightness), the operational window and base pressure of the system are limited. The lack of leak integrity is apparent from the graphs showing partial pressures during processing. Even at these high flows and pressures evidence of water vapour (17 and 18 atomic mass units (amu)) and nitrogen (28 amu) are evident. The process described in Nagasawa uses a first gas precursor, pumps out that gas, and then flows a second precursor to form silicon carbide. However, the inventor believes that the exposure of the deposition surface to contaminants throughout the process is likely to limit the deposited film quality that the Nagasawa system is able to produce.

Despite the passage of more than a decade since the publication of Nagasawa's paper, little progress appears to have been made in creating a deposition system capable of producing device quality 3C silicon carbide films on Si, even in small wafer sizes.

Indeed, systems for depositing device quality silicon carbide films are not readily available and a settled design has not been achieved to date because a commercially viable process for depositing silicon carbide on silicon has not yet been established.

U.S. Pat. No. 5,861,346 discloses a method of forming a silicon carbide layer on a silicon substrate using a $C_{60}$ precursor.

It is desired to provide a chemical vapour deposition system and process that alleviate one or more difficulties of the prior art, or that at least provide a useful alternative.

SUMMARY

In accordance with the present invention, there is provided a chemical vapour deposition system, including:
- a process tube for receiving at least one sample, the process tube being constructed of silicon carbide, impregnated with silicon, and coated with silicon carbide;
- a pumping system to evacuate the process tube to high vacuum;
- one or more gas inlets for introducing one or more process gases into the evacuated process tube; and
- a heater to heat the process tube and thereby heat the one or more process gases and the at least one sample within the process tube to cause a material to be deposited onto the at least one sample within the process tube by chemical vapour deposition.

The high vacuum may be in the $10^{-6}$ mBar range or lower. The system may be capable of operating at temperatures up to about 1350° C.

The heater may be circumferentially disposed about a central portion of the process tube disposed between outer portions of the process tube extending from the heater, and the system may include means for cooling the outer portions of the process tube. The means for cooling the outer portions of the process tube may include at least one heat sink.

The system may include two sets of radiation baffles disposed within the process tube and being mutually spaced about a flat zone of substantially constant temperature within the process tube, the radiation baffles being configured to reduce radiant heat loss from the flat zone. At least inner ones of the radiation baffles may be composed of silicon carbide and coated with silicon carbide.

The radiation baffles may occupy respective regions within the process tube, and the one or more gas inlets may be configured to deliver the gas into respective ones of those regions. The one or more gas inlets may include at least two gas inlets.

The system may include a silicon carbide liner disposed within the process tube.

All components of the system disposed within a flat zone of substantially constant temperature within the process tube during deposition may be composed of silicon carbide coated with CVD silicon carbide.

The pumping system may be configured to evacuate the process tube from only one end, using one turbo molecular pump.

Alternatively the pumping system may include two turbo molecular pumps configured to pump from respective ends of the process tube.

The one or more gas inlets may include two gas inlets configured to introduce the one or more process gases into a flat zone of substantially constant temperature within the process tube from respective ends of the flat zone, and the system may be configured to deposit the material in successive layers by alternating use of the pumps and gas inlets so that the process gas flows in opposite directions through the flat zone during deposition of successive layers, thereby improving wafer to wafer uniformity of the deposited material.

Alternatively, the one or more gas inlets may include two gas inlets configured to introduce the one or more process gases into a flat zone of substantially constant temperature within the process tube from respective ends of the flat zone, and the system may be configured to deposit the material by simultaneous use of the pumps and gas inlets so that the process gas flows in opposite directions through the flat zone during deposition, thereby improving wafer to wafer uniformity of the deposited material.

The one or more gas inlets may include two gas inlets disposed at respective ends of the heated zone.

The system may include a gas storage reservoir configured to temporarily store a quantity of process gas and to subsequently release the stored process gas so as to rapidly increase the pressure within the process tube.

The system may be configured to use the process gases undiluted in the process tube during deposition.

The system may include point of use purifiers to reduce contamination levels of the process gases to ppb levels.

The system may include a wafer holder configured to support one or more pairs of wafers in a closely spaced back to back vertical arrangement during deposition, the close spacing between the back surfaces of each pair of wafers being sufficiently small to reduce the deposition thickness on the back surfaces and sufficient large to facilitate evacuation of the process tube.

The system may include one or more wafer holders with sets of mutually spaced v-grooves for supporting wafers in a closely spaced back to back vertical arrangement during deposition, wherein the sets of v-grooves have respective different spacings between adjacent v-grooves to enable selection of a desired wafer spacing to provide a corresponding deposition thickness on the back surfaces of the wafers and thereby to provide a corresponding stress asymmetry between the opposite faces of each wafer.

The system may be configured to deposit successive layers of a semiconductor with respective opposite doping polarities whilst maintaining the at least one sample within the process tube and under vacuum.

The gas flow in the system may be controlled by mass flow controllers via multiple gas manifolds and multiple bypass pumping arrangements to enable each of a plurality of process gas flows to independently stabilise while bypassing the process tube, before switching the stabilised process gas flow into the process tube.

The material may be silicon carbide.

The material may be silicon carbide and the at least one sample may be at least one single-crystal silicon wafer, the silicon carbide being device quality single-crystal silicon carbide deposited epitaxially on the at least one single-crystal silicon wafer.

The present invention also provides a chemical vapour deposition process, including:
placing a sample in a process tube constructed of silicon carbide, impregnated with silicon, and coated with silicon carbide;
evacuating the process tube to high vacuum;
heating the process tube and thereby heating the at least one sample within the process tube; and
introducing one or more process gases into the evacuated and heated process tube to cause a material to be deposited onto the heated at least one sample within the process tube by chemical vapour deposition.

The high vacuum may be in the $10^{-6}$ mBar range or lower.

The process tube may be simultaneously pumped from respective ends, and the one or more process gases may be simultaneously introduced into a flat zone of substantially constant temperature within the process tube from respective ends of the flat zone to improve the wafer to wafer uniformity of the deposited material.

The material may be deposited on the at least one sample in a flat zone of substantially constant temperature within the process tube, and the material may be deposited as one or more pairs of successive layers of the material, wherein the net gas flows through the flat zone during deposition of successive layers of each pair are in opposite directions to improve the wafer to wafer uniformity of the deposited material.

The process may include releasing a quantity of stored process gas into the process tube to rapidly increase pressure within the process tube.

The one or more process gases may be used undiluted in the process tube during deposition.

The at least one sample may include a plurality of wafers, and the process may include supporting the wafers in a closely spaced back to back vertical arrangement during deposition, the close spacing between the back surfaces of each pair of wafers being sufficiently small to reduce the deposition thickness on the back surfaces of the wafers and sufficiently large to facilitate evacuation of the process tube.

The at least one sample may include a plurality of wafers, and the process may include supporting the wafers in a mutually spaced arrangement during deposition so that the material is deposited substantially equally on both sides of each wafer to provide substantially equal stress thereon.

The process may include depositing successive layers of a semiconductor with respective opposite doping polarities whilst maintaining the at least one sample within the process tube and under vacuum.

The material may be silicon carbide. The at least one sample includes at least one single-crystal silicon wafer, and the material may be device quality single-crystal silicon carbide deposited epitaxially on the at least one single-crystal silicon wafer.

The present invention also provides a chemical vapour deposition system having components configured for performing any one of the above processes.

Also described herein is a hot wall vacuum furnace in which the furnace wall is a tube constructed of silicon carbide, impregnated with silicon and coated with silicon carbide to provide a high vacuum and high temperature capable processing vessel.

BRIEF DESCRIPTION OF THE DRAWINGS

Some embodiments of the present invention are hereinafter described, by way of example only, with reference to the accompanying drawings, wherein like reference numerals refer to like elements, and wherein.

DETAILED DESCRIPTION

Figure 1:
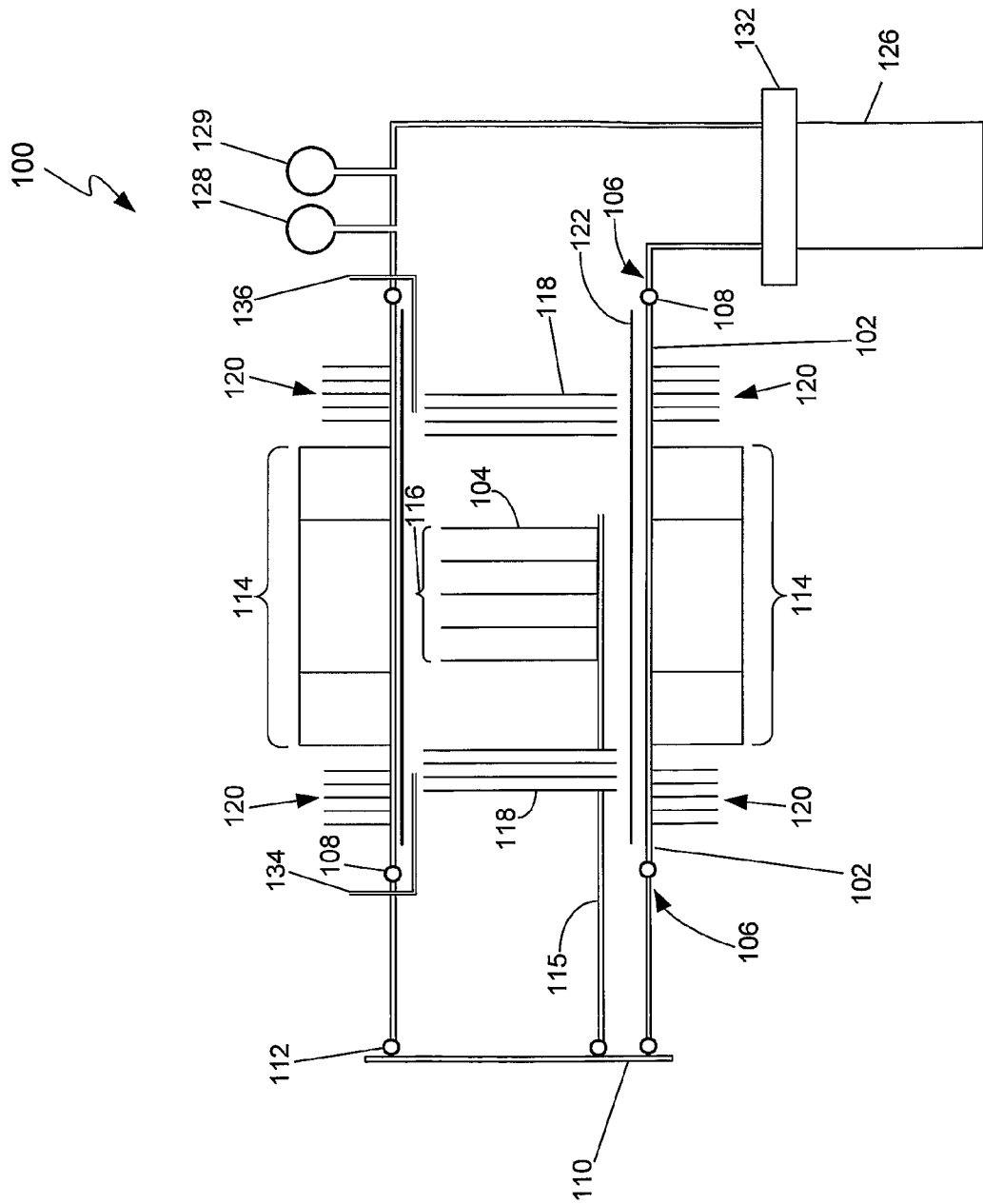
FIG. 1 is a schematic cross-sectional side view of a first embodiment of a chemical vapour deposition system.
Figure 2:
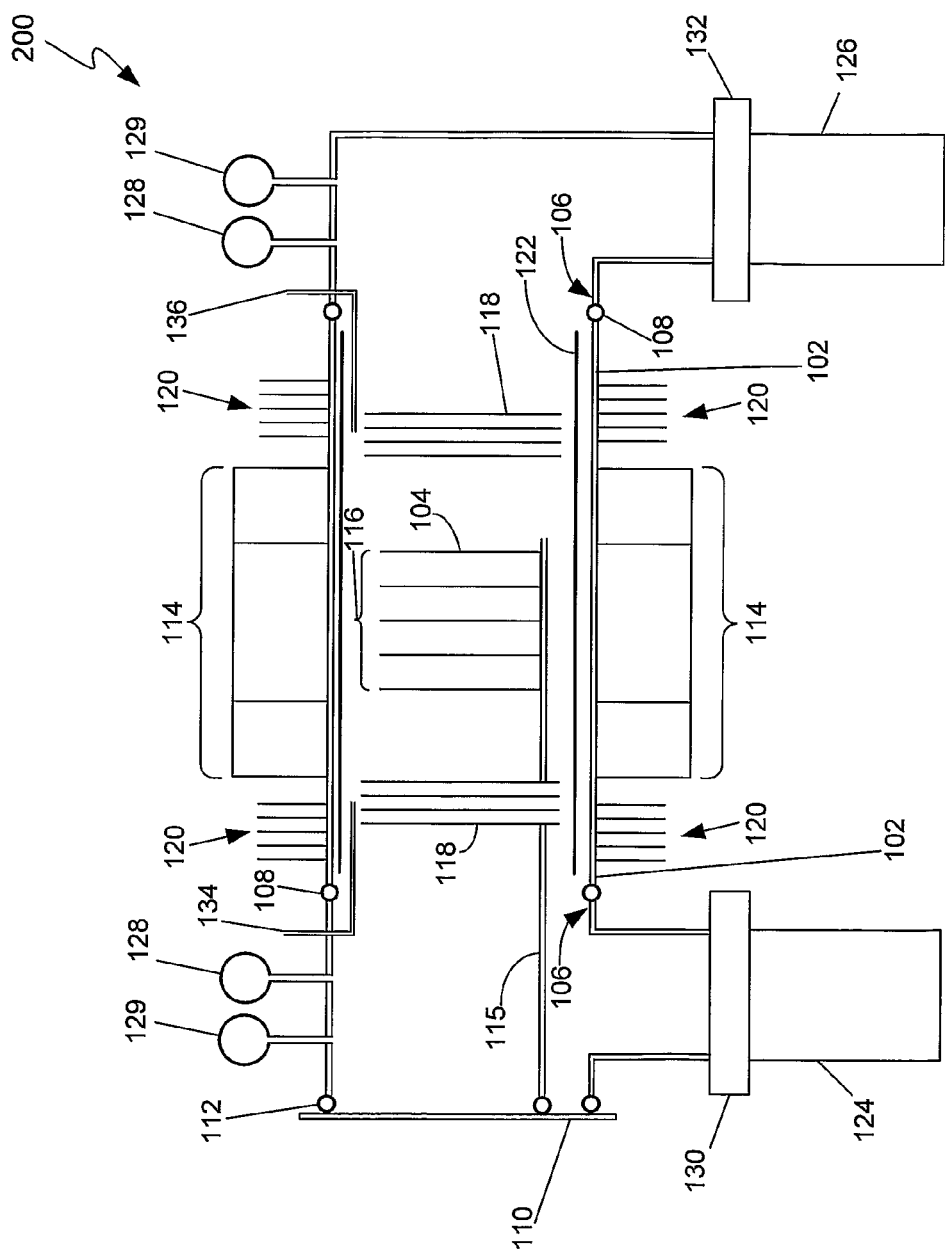
FIG. 2 is a schematic cross-sectional side view of a second embodiment of a chemical vapour deposition system.

As shown in FIGS. 1 and 2, chemical vapour deposition apparatus or systems 100, 200 include a cylindrical process tube 102 for receiving substrates or samples (typically silicon wafers) 104 onto which one or more thin layers or films of one or more materials are deposited by chemical vapour deposition (CVD). The systems 100, 200 are described below in terms of the deposition of single-crystal films of silicon carbide (SiC) onto single-crystal silicon (Si) wafers, an application for which the systems 100, 200 were originally developed. However, it should be understood that the systems 100, 200 and other embodiments of the present invention can also or alternatively be used to deposit other materials, other semiconductor materials (including other compound semiconductors, e.g., GaN) onto silicon, silicon carbide, or other substrates. As will be appreciated by those skilled in the art, in this context the term 'semiconductor' includes materials that may not in fact be electrically semiconducting when deposited; i.e., whose electrical conductivity could be considered to be conducting or insulating, but that can be doped with one or more impurities to substantially change their electrical conductivity, typically by orders of magnitude.

In the systems 100, 200, the opposing ends of the process tube 102 are joined to end flanges 106 (which in other embodiments can be water cooled if desired) by way of O-ring vacuum seals 108. Access to the process tube 102 is provided by a loading door 110 connected to one of the end flanges 106 via O-ring seals 112.

In operation, substrates 104 are loaded into the process tube 102 via the loading door 110. The process tube 102 is then evacuated to a low pressure, as described further below, and then the process tube 102 is heated by a standard three zone furnace heater 114, which in turn heats the contents of the process tube 102, in particular the substrates 104, primarily by radiation. Those skilled in the art will recognise the deposition systems 100, 200 as being a form of 'hot wall' vacuum furnace, and in particular as chemical vapour deposition (CVD) reactors. The configuration of each hot wall furnace system 100, 200 enables it to provide uniform and stable processing temperatures up to 1350° C. Although the process tube 102 of the described embodiments is horizontal and the substrates 104 are supported within the process tube on a horizontal cantilever support member 115, other embodiments may have vertically oriented process tubes.

Although other embodiments may use inductive heating, in the described embodiment, the heating is produced by passing electrical current through resistive heater elements formed from Kanthal™ wire. Inductive heating of the furnace liner is more complex and usually requires and larger power requirements.

The three zone heater 114 effectively heats three adjoining regions within the process tube 102, including a central uniform temperature zone referred to in the art as a 'flat zone' (or 'reaction zone') 116 where the wafers 104 are located and the deposition takes place. As with standard wafer furnaces, ceramic and fibre insulation are used to reduce external heat losses from the heater assembly 114, and the flat zone 116 is disposed between two end zones, which are typically hotter than the flat zone 116 to allow for radiant and conductive thermal losses. Thermocouples (not shown) measuring the temperature of each zone are used to control the power to the three heater zones to achieve a uniform temperature along the flat zone 116.

The temperature stability and uniformity within the flat zone 116 is facilitated by radiation baffles 118 located at the outer edges of the two outermost heater zones, and configured to reduce radiant heat loss from the flat zone 116. In general, radiation baffles are effective if they block any direct line of sight into the three heated zones, and their number and size affect the overall heat loss. In the described embodiment, the system 100 includes two sets of radiation baffles 118 disposed within the process tube 102. Each set consists of five mutually spaced baffles with a total length of 180 mm, arranged so that the innermost baffle is just outside the portion of the process tube 102 around which the three zone heater 114 is disposed. For any given deposition system, the size of the baffles 118 is selected to provide a balance between the requirements for sufficient temperature uniformity (favouring larger baffles) and yet allow sufficient pumping speed to achieve the required processing pressure regimes (favouring smaller baffles). For example, in the system 100, the baffles 118 are circular with a diameter of 176 mm, providing a gap of 32 mm to a liner 122 of the system 100, described below. By (i) improving the temperature uniformity within the flat zone 116 and (ii) by reducing the heating of components outside the process tube 102 (in particular the O-ring seals 108, thereby maintaining both their physical integrity and also their low permeability to atmospheric gases, hence improving the vacuum), the radiation baffles 118 combined with the high vacuum pumps 128 extend the processing range and operation process control of the system 100 beyond what was possible with prior art systems, and also reduce contamination during processing In any embodiment, the shape and configuration of the radiation baffles affect the process tube pumping speed and the radiation blocking efficiency. In particular, the process tube pumping speed will generally be increased with increasing size of gaps between the edges of the baffles and the inner walls of the process tube, and/or by providing openings in the baffles themselves. However, to reduce radiation loss from the process tube 102, any such gaps or openings should be staggered or misaligned as much as possible (subject to the pumping constraints just described) so that there is no line of sight into the process tube 102. For example, the radiation baffles can be in the form of circular disks with openings that do not line up from one baffle to the next. Alternatively, some of the radiation baffles can be in the form of annular rings, with other baffles being in the form of circular discs whose outer radius/radii is/are larger than the inner radius/radii of the annular rings. It will be apparent that many other configurations and arrangements of radiation baffles can be devised to provide the advantages described above.

The process tube 102 is composed of sintered silicon carbide, impregnated with silicon, and then coated with more silicon carbide to provide a high vacuum (i.e., leak tight) and high temperature capable processing vessel. The high thermal conductivity of the process tube 102 facilitates uniform heat distribution within the flat zone 116, where the temperature accuracy and deposition uniformity both within wafer and also wafer to wafer can be maintained for long processing periods, with the temperature accuracy typically being less than ±0.5° C. at temperatures over 700° C. In the described embodiments, the process tube 102 was manufactured by AGC Electronics America, Inc.

The process tube 102 has a length of about 1200 mm and an inner diameter of about 230 mm, allowing batch processing of about four 150 mm diameter wafers supported vertically, or one 200 mm wafer supported horizontally. However, the configuration of the system 100 and in particular the system 200 allows them to be readily scaled to larger process tube diameters and/or and to greater lengths to enable processing of larger wafers and to allow processing of more wafers per batch, although this may require corresponding upscaling of the pumping system in order to meet vacuum requirements.

Although not essential, in any embodiment it is highly desirable that all of the high temperature components of the system have the same composition as the process tube 102, as in the systems 100, 200 of the described embodiments.

In general, to relax the heating and pumping requirements of the system, the length of the outer portions of the process tube 102 outside the flat zone 116 can be selected to be as short as is practical. However, in the described systems 100, 200 where the ends of the process tube 102 are sealed with O-ring seals 108, the ends of the process tube 102 need to be maintained at a temperature compatible with the vacuum sealing O-rings 108, for the reasons described above. Consequently, because silicon carbide has a high thermal conductivity, the portions of the process tube 102 projecting beyond the heater 114 may need to be actively cooled if they are very short. In the described embodiments 100, 200, this is achieved by providing the process tube 102 with heat sinks in the form of integral cooling fins 120 during manufacture. However, an alternative is to attach thermally conductive fins (which in such embodiments are not necessarily composed of SiC) to the silicon carbide tube 102 after manufacture, an arrangement that would facilitate insertion and removal of the process tube 102 from the cylindrical heater 114. However, the cylindrical heater 114 can be provided in the form of two (e.g., half-cylinder or similar) portions that can be readily decoupled to facilitate removal of the process tube 102. In any case, cooling fans can be directed across the cooling fins (or other form of heat sink) to increase cooling efficiency. Compared with water cooling, air cooling has the added benefit of lowering the thermal gradient near the ends of the process tube, thereby reducing the likelihood of thermal shock or thermal stresses that otherwise could potentially crack the silicon carbide tube 102.

During operation, the pressure and temperature within the process tube 102 can determine the reaction regime, depending on the specific process. Typically (as is the case with SiC deposition), at a given temperature, the reaction process can transform from a deposition process at higher pressures to an etching process at lower pressures. It is highly desirable that the deposition system has an operational range that encompasses both reaction regimes and thus ensures that contamination levels are sufficiently low to create high quality deposited films.

Specifically, it is desirable that the base pressure of the system, as measured in the pumping pipe work, is in the $10^{-6}$ mbar range or better. In this context, 'base pressure' refers to the routinely achievable pressure of the system 100, 200 during operation but when the process gases have been pumped out, as opposed to, for example, the ultimate pressure achievable when the system has been pumping (and possibly baked) for days or longer without performing depositions, which may be at least an order of magnitude lower again. However, as will be appreciated by those skilled in the art, the actual pressure in the flat zone 116 cannot be measured directly in general, firstly because vacuum gauges 128, 129 need to be positioned outside the SiC process tube 102, and consequently the pressure read by such gauges 128, 129 is likely to be lower than the real pressure in the flat zone 116. Secondly, although capacitance manometers are excellent at measuring pressure during deposition because they are process gas compatible and independent of gas composition, the lowest pressures they can measure are in the $10^{-4}$ mbar range. Conversely, high vacuum gauges can measure pressures below about $10^{-5}$ mbar, but are not generally process compatible. Additionally, the higher the temperature of the ends of the process tube 102 at the O-rings 108, the greater the likelihood of gas permeating through the O-rings 108. Thus any pressure readings need to be understood in the context of these qualifications.

To achieve a high vacuum base pressure ~$10^{-6}$ mbar or better, actual and virtual vacuum leaks and the pumping speed of the system need to be sufficient to achieve this base pressure in an acceptable timeframe. The larger the diameter of the process tube 102, the better its pumping conductance. Undesirable gas sources within the system include outgassing from the components of the system, and of course any virtual and actual leaks. As components of and within the system 100, 200 are heated during operation, the vacuum integrity of the system 100, 200 and any outgassing from components of or within the system 100, 200 needs to be very low and to be maintained during thermal cycling.

As atomic bonding of newly deposited material can be weak, the use of process gas precursors at relatively low pressures that reduce further bombardment is therefore desirable and consequently precursors are not diluted with inert gases such as argon during deposition.

Where layers of different electrical polarity are formed in the deposited film, it is highly desirable that these layers (e.g., from n-type to p-type and p-type to n-type layers is achieved) are deposited sequentially in the same process tube 102 and without breaking vacuum, both to reduce contamination and or defects at the interfaces, and also to boost productivity.

During the deposition process, dopant precursors such as tri-methyl-aluminum (TMA1) can be adsorbed onto the reactor components and subsequently desorbed later in the process, including when a layer of opposite doping polarity is being formed, in which case the desorbed species may interfere with the desired doping. To reduce such adsorption and subsequent desorption, the reactor components exposed to the precursors, particularly outside the flat zone 116, are maintained at as high a temperature as is practical during the overall deposition process, and to this end the system 100 includes a cylindrical liner 122 within the process 102 tube. In the described embodiments, the composition of the liner 122 is the same as the process tube 102; that is, it is formed from silicon carbide impregnated with Si. Once installed, the inner surface of the liner 122 was then CVD coated with SiC in situ. The use of the liner 122 is beneficial because, unlike the furnace tube 102, the liner 122 does not seal to O-rings, and consequently the entirety of the liner 122 can be maintained at a high temperature, whereas the outer portions of the process tube 102 need to be cooler, as described above, thus allowing greater absorption onto those cooler portions. By sealing the inner and outer surfaces of the liner 122 with a layer of CVD SiC, absorption and/or permeation of dopants within the liner 122 is inhibited, thus inhibiting undesirable dopant contamination that might otherwise occur, in particular if a conventional material such as fused silica/quartz was used.

By ensuring that the internal system components are hot enough to prevent or inhibit gas absorption and subsequent desorption, dopant memory effects are thus avoided. This enables sequential processing such as the sequential deposition of n-type and n-type doped layers in the same system. The liner 122 also provides benefits for system maintenance because it can easily be removed for cleaning or replaced.

Vacuum System

As described above, the process tube 102 is composed of sintered SiC, sealed by impregnating it with silicon and then coating it with a layer of CVD SiC to ensure that the system 100 can operate at a high vacuum (in the $10^{-6}$ mbar range or better) base pressure. To achieve this degree of vacuum, the system 100 and the system 200 respectively use one and two turbo-molecular pumps 124, 126. Turbo pumps are process gas compatible, and selected models can handle high gas loads. In the systems 100, 200, the pumps 124, 126 are out of the line of sight of the hot zones of the process tube 102 to ensure that the pumps 124, 126 are not directly exposed to radiant heat from the process tube 102, which otherwise might degrade the performance of the pumps 124, 126 or even cause pump failure.

To facilitate loading and unloading of wafers 104, the systems 100, 200 are vented to atmospheric pressure with an inert high purity gas such as argon that will not act as an impurity or contaminant in the deposited material.

Under vacuum, any gases and water vapour adsorbed onto the furnace walls are released and this will increase the time taken to achieve high vacuum and also increase the risk and degree of contamination. To reduce such contamination, pump down time, temperature ramp up time, and thermal cycling, the temperature of the flat zone 116 is maintained to at least 600° C., other components in the pump pipe work are also heated, and the system 100, 200 is purged during loading to reduce atmospheric contamination of the reactor components. In the system 100, 200, sample loading can take place at furnace temperatures up to 800° C. In other embodiments, a glove box or similar inert environment area, and/or vacuum load lock can be included to further benefit productivity and reduce the risk of contamination during the unloading and loading of samples.

Once the samples 104 have been loaded into the process tube 102 and the load door 110 closed, a roughing pump (not shown) is used to evacuate the system to <1 mbar. This evacuation is controlled to reduce turbulence that might otherwise lead to particle contamination. The use of a separate roughing pump (as opposed to using a backing pump used with the turbo pumps 124, 126) reduces the exposure of the backing pumps to gases that are not process gases or process byproducts. The turbo-molecular pumps 124, 126 are then used to reduce the pressure within the system 100, 200 (as measured by high vacuum gauges 128) to below at least $10^{-5}$ mbar and typically into and below $10^{-6}$ mbar range. At these pressure levels, the physical configuration of the system 100, 200, its pumping capability, its gas inlets and outlets, vacuum seals, the composition of internal surfaces and components, and temperature all have an effect on the ability to achieve and maintain low pressures. The pumping conductance (or resistance) of the system 100, 200 also depends on the number and size of the radiation baffles 118 used to maintain a uniform temperature in the reaction zone 116. Pressure control can be effected by changing the pumping conductance via valves 130, 132 which control the pumping conductance and can be part of a closed loop pressure control system using feedback from the capacitance manometer pressure gauges 129. At low processing pressures in the molecular flow regime, the pressure control is better effected by controlling gas flow. Those skilled in the art will appreciate that all of these factors can influence pumping conductance and the time taken to reach desired vacuum levels.

Gas Delivery System

Another important aspect of the systems 100, 200 is the management and delivery of gases/precursors used in the deposition processes. High purity and ultra high purity gases are used. To achieve extremely low contamination levels, the systems 100, 200 include an internally electro-polished welded stainless steel tube gas handling sub-system with VCR fittings and point-of-use purifiers 206 to reduce the amounts of water, CO, $CO_2$, and $O_2$ from ppm to ppb contamination levels.

The systems 100, 200 include mass flow controllers 204, multiple process gas manifolds, multiple bypass pumping, and multiple gas inlets 134, 136, providing process flexibility, gas delivery precision, and productivity advantages. The multiple manifolds and bypass pumping allow gas flows from the mass flow controllers to be stabilized by flowing gas to the backing pump before process gases are switched into the reactor. This is particularly important for deposition processes that are sensitive to pressure and/or flow rates. Standard mass flow controllers typically take several seconds to stabilise when operating towards the bottom end (e.g., ≥5%) of their flow range. By allowing the mass flow controllers to stabilise for a few seconds when flowing gas directly to the process vacuum pump (i.e., bypassing the process tube 102), the stabilised gas flow can then be switched to flow through the process tube 102 when required.

Some deposition processes (including the SiC deposition process described herein) involve at least two alternating steps where respective process gases are introduced into the reactor to respective pressures, with each step requiring the process gas for the other step(s) to be pumped out prior to introducing the appropriate process gas for the current step. This repeating sequence of pump out and process gas introduction increases the duration of the overall deposition process, and hence the cost of the process. In particular, as the reactor chamber has a large volume, each time a new process gas is introduced into the reactor, it can take a substantial period of time to build up to the desired process pressure for that gas.

Figure 3:
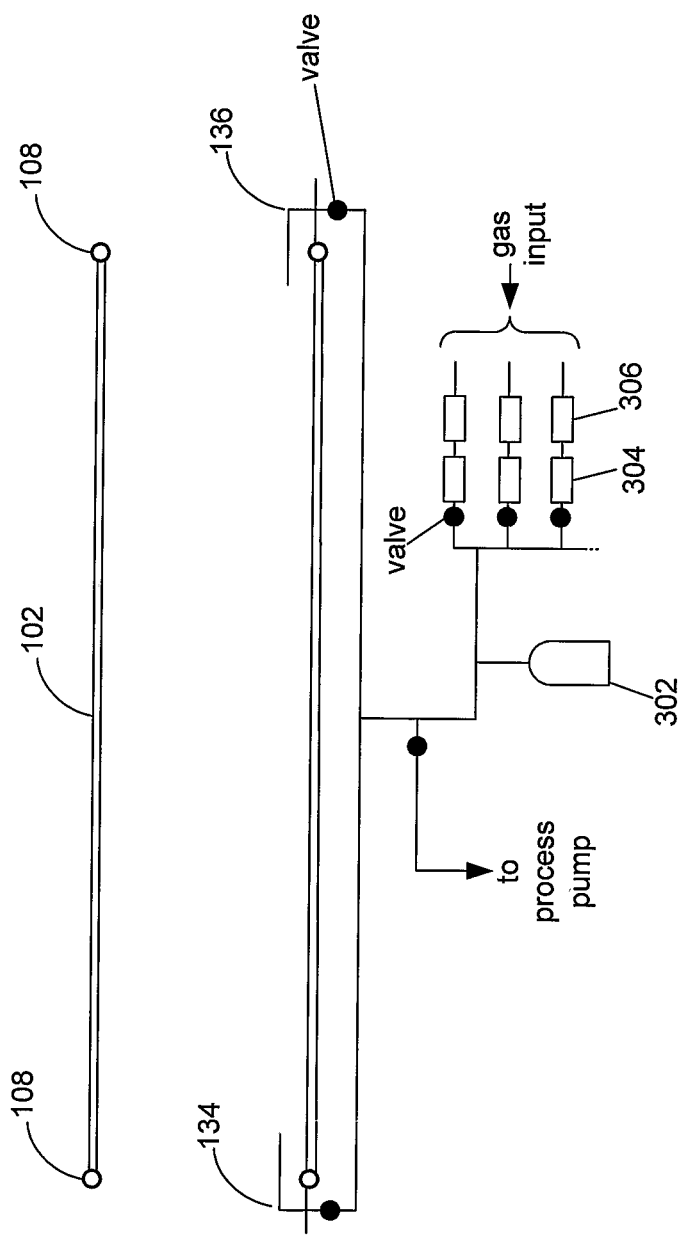
FIG. 3 is a schematic cross-sectional side view of a process tube and gas manifold of the systems of FIGS. 1 and 2.

To alleviate this difficulty, the systems 100, 200 include a gas reservoir 302, as shown in FIG. 3, for temporary storage and subsequent release of process gases. For example, when the reactor chamber has been pumped out to a desired pressure and the next process gas is to be introduced into the reactor, the manifold valve is opened to release a burst of the stored process gas into the reactor chamber. In combination with pumping speed control, this allows the pressure in the process tube 102 to be very quickly raised and maintained if desired, thus reducing the duration of the overall deposition process and reducing cost. Although shown as a separate component in FIG. 3, in the described systems 100, 200 the gas reservoir 302 is provided by the volume of the gas manifold pipework itself, where the total length and diameter(s) of the pipework determine the reservoir volume. However, other embodiments may use a separate reservoir arrangement similar to that shown in FIG. 3.

For example, consider a deposition system having a 200 L vacuum system volume in which a selected pumping speed and a steady state gas flow of 10 cc per minute gives a pressure of 76 mTorr in the reactor. From a low pressure (<<76 mTorr), 20 cc of the gas can be released essentially instantaneously to raise the pressure in the 200 L system to about 76 mTorr. This pressure can then be maintained by flowing 10 cc of gas at the selected pumping speed, assuming $P_1V_1=P_2V_2$ and constant temperature. In the absence of the gas reservoir 302, it would typically take several minutes to achieve the set pressure. As an alternative, a similar pressure control can be achieved using multiple mass flow controllers (MFCs) to rapidly introduce each process gas followed by ramp down of gas flow, but this requires multiple MFCs for each process gas due to the limited flow range of each MFC. As some deposition reactions can occur very quickly, a rapid transition to the desired process pressure can avoid long pressure stabilization times and hence substantially reduce the duration of the overall process.

As will be appreciated by those skilled in the art, when operating at low pressures and high pumping speeds, the pressure along the flat zone 116 is non-uniform. Because gas pressure represents the frequency of gas collisions with the deposition (e.g., wafer) surface, a variation in the deposition rate is expected along the process tube 102. This is further complicated by gas resonance time and depletion effects that can also affect the deposition rate. To provide greater wafer to wafer uniformity of coating thickness, each system 100, 200 includes gas injectors 134 in the form of tubes internal to the reactor volume to introduce gas directly into the heater assembly zone within the radiation baffles 118. The gas delivery system allows gas to be introduced from either end of the process tube 102 at a time, as described further below, or from both ends simultaneously.

When processing in the molecular flow regime, where gas collisions are primarily with surfaces and very rarely with other gas molecules, and at high pumping speeds, pressure variation along the flat zone 116 is inevitable. In some process regimes, typically when precursor species have very low sticking coefficients, the gas pressure corresponds directly with the deposition rate; i.e., depletion of the precursor does not substantially influence the deposition rate. With any deposition system that batch processes many wafers disposed along an elongate flat zone, the deposition rates can vary significantly from wafer to wafer, making volume commercial production with precise deposition thickness control difficult. A linear reduction in pumping speed along the flat zone 116 could cause a corresponding linear change in deposition rate. To obtain high precision and uniformity along the batch of wafers 104, the system 200 shown in FIG. 2 includes two turbo pumps 124, 126 and respective pressure control systems 130, 132 at opposite ends of the reactor. By simultaneously using both sets of gas injectors 134 and turbo pumps 124, 126 during deposition, the resulting symmetry of the system 200 improves the uniformity of process gas pressure along the flat zone 116 and hence improves the wafer to wafer uniformity.

Alternatively, the wafer to wafer uniformity can be improved by reversing the net process gas flow at successive deposition steps. Specifically, by alternating (i) use of left turbo pump 124 and its opposite (right) gas injector 136 with (ii) the right turbo pump 126 and its opposite (left) gas injector 134), the symmetry of the system 200 improves the wafer to wafer uniformity of deposition thickness over each pair of successive alternating deposition steps. This also allows large variations in gas flows and process conditions to be used, and reduces maintenance and cleaning issues associated with gas injectors that enter the hot and even into the flat zone of the furnace. The system 200 of FIG. 2 thus provides better wafer to wafer uniformity of deposited materials than the single pump system 100 of FIG. 1, and is consequently more scalable to larger wafers and/or to larger batch sizes.

As shown in FIG. 2, the gas injectors 134 are arranged to introduce processes gases at locations that are about midway along the radiation baffles 118. If the process gases were introduced outside the radiation baffles 134 and closer to the turbo pumps 124, 126, then when both sets of injectors 134 and turbo pumps 124, 126 are operating simultaneously in molecular flow mode, then the utilisation of the (typically expensive and toxic) process gases is low because a substantial portion of each process gas is pumped directly to the turbo pump at the same end of the system 100, 200 without passing through the process tube 102. Additionally, dopant gases in these regions can be absorbed onto the relatively cold surfaces of the system 100, 200 and thus cause dopant poisoning for subsequent deposition steps.

Conversely, if the process gases were introduced within the heated zones, then the high temperatures in these regions can cause the process gases to react and/or decompose within the gas injectors 134, blocking them at least partially and thereby interfering with the deposition process, and potentially requiring the system 100, 200 to be opened for cleaning.

The arrangement of the gas injectors 134 in the systems 100, 200 is thus chosen to mitigate the above difficulties.

Semiconductor wafers in any horizontal furnace tube are normally mounted in a jig or wafer boat that supports the wafers in a vertical and equally spaced arrangement. The systems 100, 200 include wafer boats that, like the process tube 102, is composed of silicon carbide impregnated with silicon and coated with CVD silicon carbide. The wafer boats are configured to reduce disruption to process gases reaching the wafer surface by positioning the ends of the boats well away from the wafers 104 (in this case at least 50 mm), and by reducing the number and thickness of the longitudinal support rails as far as is practical. Single wafers are supported by flat bottomed V-shaped grooves, and deposition occurs on both the front and back of the wafer. Indeed, this is a major advantage of the systems 100, 200 described herein over prior art deposition systems that require the substrate wafer to be placed horizontally on a heater, and hence that deposit only on one surface of the wafer. This is because the asymmetric stresses caused by deposition on only one side of a wafer causes wafer deformation or 'bow' that distorts the wafer and thus causes difficulties for subsequent planar processing, such as lithography.

However, in cases where wafer bow is not a concern, one wafer boat includes V-grooves with 0.83 or 1.5 mm wide flat bottoms and 30° sidewalls that allow two wafers to be supported back to back, therefore inhibiting deposition on the backsides of the wafers and reducing cost by allowing more wafers to be processes in a single batch. Other wafer boats include V-grooves mutually spaced by different spacings to support wafers with a selected small gap between their backs to facilitate pump out while reducing backside deposition by a desired amount. The optimum size of the gap in any situation depends on the wafer size and the particular deposition process used. The ability to select a desired wafer to wafer spacing can be particularly advantageous in certain situations where deposition is made onto pre-processed wafers having unequal stresses on respective sides of each wafer. Such wafers can be placed back-to-back in a wafer boat at a spacing selected to deposit a selected amount of material on the wafer backsides to at least partially compensate or balance the pre-existing stress.

To achieve the desired processing conditions, all components with the heated vacuum zone 116 are composed of high vacuum compatible silicon carbide that is coated with CVD silicon carbide. The CVD coating can be pre-existing, or can be deposited as part of the initial conditioning process of the system. In other embodiments, it is desirable that at least the highest temperature (i.e., innermost) radiation baffles, the liner 122, the cantilever support member 115, and the wafer boat are thus composed. In some embodiments, the lower temperature baffles and the gas injectors can be made from quartz, albeit as the increased risk of contamination and degradation. The use of the same SiC materials within the process tube 102 of each system 100, 200 minimizes thermal expansion differences, which in turn reduces particle contamination. Any cracking of deposited films may also degrade the vacuum performance.

As with other deposition systems, each system 100, 200 includes microprocessors (not shown) that enable recipe-driven, fully automated control with data logging. In addition, hardware and software safety interlocks are used to meet equipment and personnel safety requirements.

From the above description, those skilled in the art will realize that the invention provides an improved chemical vapour deposition system. In particular, the systems described herein allow high quality layers of compound semiconductors such as SiC to be deposited over large areas. For example, the system 100, and in particular the system 200 described above can be readily scaled to large wafer sizes (e.g., 150 mm, 300 mm, or more and larger wafer batches (i.e., more wafers) to enable commercial scale production. Those skilled in the art will also realize that the invention can be implemented in many embodiments other than those described herein without departing from the scope of the present invention.

The invention claimed is:

1. A chemical vapour deposition system, including:
   a process tube configured to receive at least one sample for deposition of a material thereon;
   a pumping system to evacuate the process tube;
   one or more gas inlets for introducing one or more process gases into the evacuated process tube;
   a heater to heat the process tube and thereby heat the one or more process gases and the at least one sample within the process tube to cause the material to be deposited onto the at least one sample within the process tube by chemical vapour deposition; and
   two sets of radiation baffles disposed within the process tube and being mutually spaced about a flat zone of substantially constant temperature within the process tube, the radiation baffles being configured to reduce radiant heat loss from the flat zone;
   wherein the pumping system is configured to evacuate the process tube from respective ends thereof, and the process tube is constructed of silicon carbide, impregnated with silicon, and coated with silicon carbide so as to have a vacuum integrity such that, in combination with the pumping speed of the pumping system, and the pumping conductance and vacuum integrity of the pumping system, the pumping system is adapted to evacuate the process tube to a high vacuum base pressure in the $10^{-6}$ mBar range or lower.

2. The system of claim 1, wherein the pumping system includes turbo molecular pumps configured to evacuate the process tube from respective ends thereof.

3. The system of claim 1, wherein the system is capable of operating at temperatures up to about 1350° C.

4. The system of claim 1, wherein the heater is circumferentially disposed about a central portion of the process tube disposed between outer portions of the process tube extending from the heater, and the system includes means for cooling the outer portions of the process tube.

5. The system of claim 4, wherein the means for cooling the outer portions of the process tube includes at least one heat sink.

6. The system of claim 1, wherein at least inner ones of the radiation baffles are composed of silicon carbide impregnated with silicon and coated with silicon carbide.

7. The system of claim 1, wherein the radiation baffles occupy respective regions within the process tube, and the one or more gas inlets are configured to deliver the gas into respective ones of those regions.

8. The system of claim 1, wherein the one or more gas inlets include at least two gas inlets.

9. The system of claim 1, including a silicon carbide liner disposed within the process tube.

10. The system of claim 1, wherein all components of the system disposed within the flat zone of substantially constant temperature within the process tube during deposition are composed of silicon carbide impregnated with silicon and coated with CVD silicon carbide.

11. The system of claim 1, wherein the one or more gas inlets include two gas inlets configured to introduce the one or more process gases into the flat zone of substantially constant temperature within the process tube from respective ends of the flat zone, and the system is configured to deposit the material in successive layers by alternating use of the pumps and gas inlets so that the process gas flows in opposite directions through the flat zone during deposition of successive layers, thereby improving wafer to wafer uniformity of the deposited material.

12. The system of claim 1, wherein the one or more gas inlets include two gas inlets configured to introduce the one or more process gases into the flat zone of substantially constant temperature within the process tube from respective ends of the flat zone, and the system is configured to deposit the material by simultaneous use of the pumps and gas inlets so that the process gas flows in opposite directions through the flat zone during deposition, thereby improving wafer to wafer uniformity of the deposited material.

13. The system of claim 1, wherein the one or more gas inlets include two gas inlets disposed at respective ends of the heated zone.

14. The system of claim 1, including a gas storage reservoir configured to temporarily store a quantity of process gas and to subsequently release the stored process gas so as to rapidly increase the pressure within the process tube.

15. The system of claim 1, wherein the system is configured to use the process gases undiluted in the process tube during deposition.

16. The system of claim 1, including point of use purifiers to reduce contamination levels of the process gases to ppb levels.

17. The system of claim 1, including a wafer holder configured to support one or more pairs of wafers in a closely spaced back to back vertical arrangement during deposition, the close spacing between the back surfaces of each pair of wafers being sufficiently small to reduce the deposition thickness on the back surfaces and sufficient large to facilitate evacuation of the process tube.

18. The system of claim 1, including one or more wafer holders with sets of mutually spaced v-grooves for supporting wafers in a closely spaced back to back vertical arrangement during deposition, wherein the sets of v-grooves have respective different spacings between adjacent v-grooves to enable selection of a desired wafer spacing to provide a corresponding deposition thickness on the back surfaces of the wafers and thereby to provide a corresponding stress asymmetry between the opposite faces of each wafer.

19. The system of claim 1, wherein the system is configured to deposit successive layers of a semiconductor with respective opposite doping polarities whilst maintaining the at least one sample within the process tube and under vacuum.

20. The system of claim 1, wherein gas flow in the system is controlled by mass flow controllers via multiple gas manifolds and multiple bypass pumping arrangements to enable each of a plurality of process gas flows to independently stabilise while bypassing the process tube, before switching the stabilised process gas flow into the process tube.

21. The system of claim 1, wherein the material is silicon carbide.

22. The system of claim 21, wherein the material is silicon carbide and the at least one sample is at least one single-crystal silicon wafer, the silicon carbide being device quality single-crystal silicon carbide deposited epitaxially on the at least one single-crystal silicon wafer.

23. A chemical vapour deposition process, including:
placing a sample in a process tube constructed of silicon carbide, impregnated with silicon, and coated with silicon carbide to provide vacuum integrity, the sample placed in the process tube within a flat zone having a substantially constant temperature, wherein two sets of radiation baffles are mutually spaced about the flat zone to reduce radiant heat loss from the flat zone;
evacuating the process tube from respective ends thereof simultaneously, and at a pumping speed and pumping conductance such that, in combination with the vacuum integrity of the process tube, the process tube is evacuated to a high vacuum base pressure in the $10^{-6}$ mBar range or lower;
heating the evacuated process tube and thereby heating the at least one sample within the evacuated process tube; and
introducing one or more process gases into the evacuated and heated process tube to cause a material to be deposited onto the heated at least one sample within the process tube by chemical vapour deposition.

24. The process of claim 23, wherein during deposition the process tube is simultaneously pumped from respective ends, and the one or more process gases are simultaneously introduced into the flat zone of substantially constant temperature within the process tube from respective ends of the flat zone to improve the wafer to wafer uniformity of the deposited material.

25. The process of claim 23, wherein the material is deposited on the at least one sample in the flat zone of substantially constant temperature within the process tube, and the material is deposited as one or more pairs of successive layers of the material, wherein the net gas flows through the flat zone during deposition of successive layers of each pair are in opposite directions to improve the wafer to wafer uniformity of the deposited material.

26. The process of claim 23, including releasing a quantity of stored process gas into the process tube to rapidly increase pressure within the process tube.

27. The process of claim 23, wherein the one or more process gases are used undiluted in the process tube during deposition.

28. The process of claim 23, wherein the at least one sample includes a plurality of wafers, and the process includes supporting the wafers in a closely spaced back to back vertical arrangement during deposition, the close spacing between the back surfaces of each pair of wafers being sufficiently small to reduce the deposition thickness on the back surfaces of the wafers and sufficiently large to facilitate evacuation of the process tube.

29. The process of claim 23, wherein the at least one sample includes a plurality of wafers, and the process includes supporting the wafers in a mutually spaced arrangement during deposition so that the material is deposited substantially equally on both sides of each wafer to provide substantially equal stress thereon.

30. The process of claim 23, including depositing successive layers of a semiconductor with respective opposite doping polarities whilst maintaining the at least one sample within the process tube and under vacuum.

31. The process of claim 23, wherein the material is silicon carbide.

32. The process of claim 23, wherein the at least one sample includes at least one single-crystal silicon wafer, and the material is device quality single-crystal silicon carbide deposited epitaxially on the at least one single-crystal silicon wafer.

33. A chemical vapour deposition system having components configured for performing the process of claim 23.

* * * * *